United States Patent
Kerdiles et al.

(10) Patent No.: US 7,645,682 B2
(45) Date of Patent: Jan. 12, 2010

(54) BONDING INTERFACE QUALITY BY COLD CLEANING AND HOT BONDING

(75) Inventors: Sebastien Kerdiles, Saint-Ismier (FR); Willy Michel, Grenoble (FR); Walter Schwarzenbach, Saint Nazaire les Eymes (FR); Daniel Delprat, Crolles (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 24 days.

(21) Appl. No.: 11/873,311

(22) Filed: Oct. 16, 2007

(65) Prior Publication Data
US 2008/0200008 A1    Aug. 21, 2008

(30) Foreign Application Priority Data
Feb. 16, 2007    (FR) .................................. 07 53318

(51) Int. Cl.
*H01L 21/76* (2006.01)
*H01L 21/46* (2006.01)
*H01L 21/30* (2006.01)
*H01L 21/461* (2006.01)

(52) U.S. Cl. ...................... 438/455; 438/118; 438/402; 438/406; 438/474; 438/715; 257/E21.119; 257/E21.122; 257/E21.561; 257/E21.567; 257/E21.568

(58) Field of Classification Search .......... 257/E21.482, 257/E21.122, E21.567, E21.568, E21.119, 257/E21.561
See application file for complete search history.

(56) References Cited

U.S. PATENT DOCUMENTS

| | | | | |
|---|---|---|---|---|
| 5,223,168 A | * | 6/1993 | Holt | 510/238 |
| 6,018,211 A | * | 1/2000 | Kanaboshi et al. | 310/313 R |
| 6,342,433 B1 | * | 1/2002 | Ohmi et al. | 438/455 |
| 6,388,290 B1 | | 5/2002 | Celler et al. | 257/350 |
| 7,446,019 B2 | * | 11/2008 | Daval et al. | 438/459 |
| 2004/0035525 A1 | * | 2/2004 | Yokokawa et al. | 156/281 |
| 2004/0262686 A1 | | 12/2004 | Shaheen et al. | 257/347 |
| 2005/0218111 A1 | | 10/2005 | Maleville et al. | 216/33 |
| 2006/0240642 A1 | | 10/2006 | Kerdiles | 438/455 |
| 2006/0273068 A1 | | 12/2006 | Maunand Tussot et al. | 216/33 |
| 2007/0090479 A1 | * | 4/2007 | Chen et al. | 257/433 |
| 2007/0119812 A1 | * | 5/2007 | Kerdiles et al. | 216/34 |

FOREIGN PATENT DOCUMENTS

| EP | 0 969 500 A2 | 1/2000 |
|---|---|---|
| FR | 2 868 599 | 10/2005 |
| FR | 2 884 966 A1 | 10/2006 |

OTHER PUBLICATIONS

French Search Report for FR 0753318, Sep. 18, 2007.

* cited by examiner

*Primary Examiner*—Charles D Garber
*Assistant Examiner*—Mohsen Ahmadi
(74) *Attorney, Agent, or Firm*—Winston & Strawn LLP

(57) ABSTRACT

The invention relates to improvements in a method for molecularly bonding first and second substrates together by placing them in surface to surface contact. The improvement includes, prior to placing the substrates in contact, cleaning the surface of one or both of the substrates in a manner to provide a cleaned surface that is slightly roughened compared to a conventionally polished surface, and heating at least one or both of the substrates prior to placing the substrates in contact while retaining the heating at least until the substrates are in surface to surface contact.

23 Claims, 2 Drawing Sheets

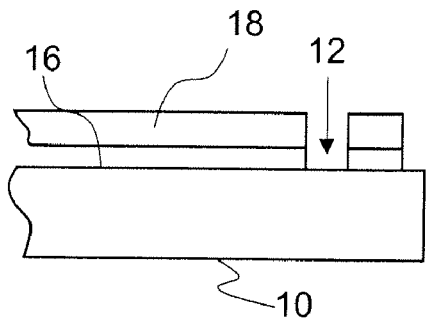
FIG. 1 - Prior Art
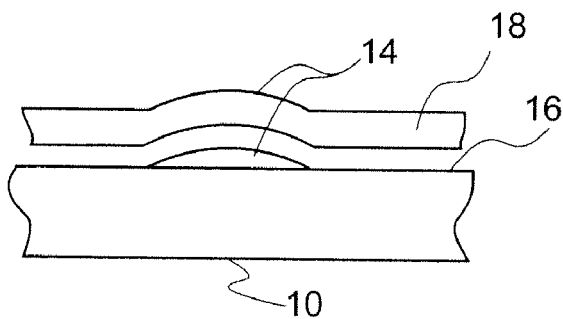
FIG. 2 - Prior Art
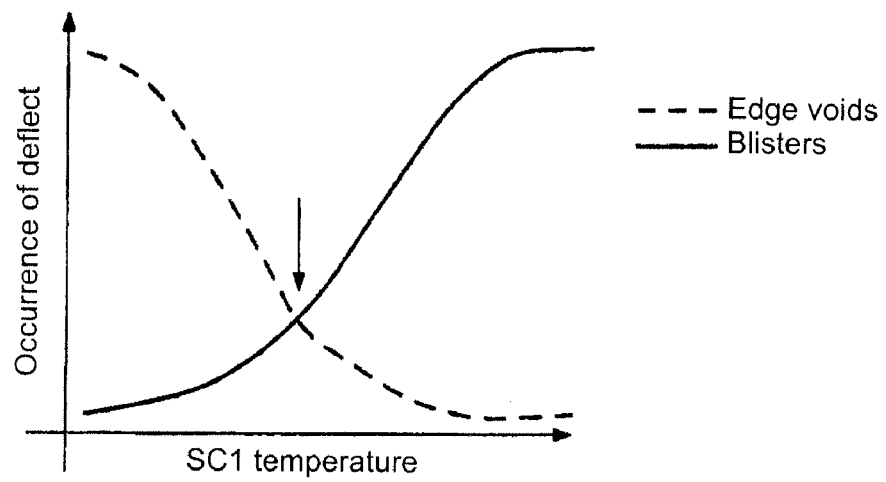
FIG. 3
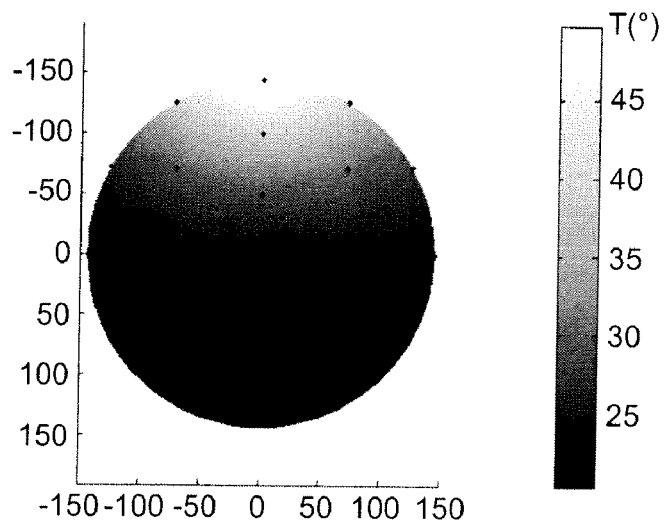
FIG. 5

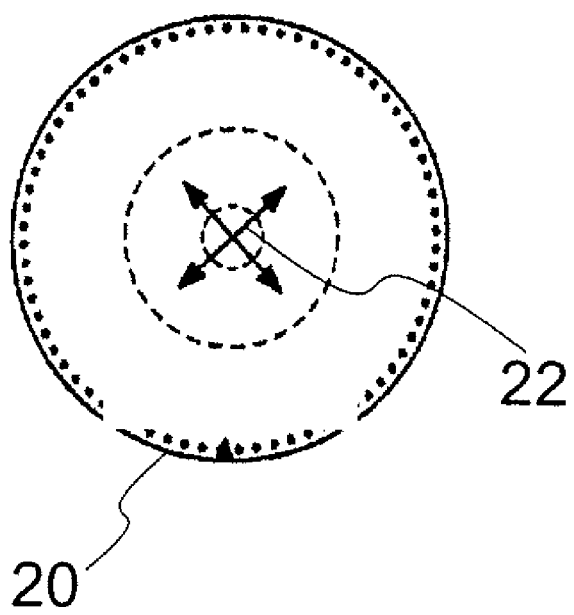
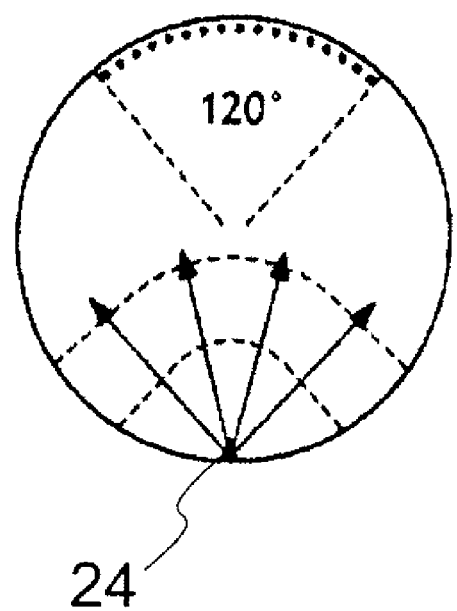
FIG. 4a  FIG. 4b

BONDING INTERFACE QUALITY BY COLD CLEANING AND HOT BONDING

FIELD OF THE INVENTION

The present invention relates to making composite structures for electronics, optics or microelectronics. More precisely, the invention relates to a method for bonding two semiconductor substrates together.

BACKGROUND

Semiconductor substrate bonding typically involves contacting a first substrate with a second substrate and bonding the two substrates together via molecular adhesion. This type of bonding is common for Semiconductor On Insulator, (SeOI) type structures, and Silicon On Insulator (SOI) type structures. In this context, at least one of the substrates to be bonded presents a surface oxide layer; typically $Si/SiO_2$ bonding or $SiO_2/SiO_2$ bonding is performed in order to form an SOI structure.

Molecular adhesion bonding allows two substrates with perfectly flat ("polished mirror") surfaces to adhere to each other without applying adhesive (e.g., paste, glue). The substrate surfaces are generally those of substrates in electrically insulating materials (e.g., crystal, glass) or in semiconductor materials (e.g., Si, GaAs, SiC, Ge). Bonding is typically initiated by the local application of slight pressure on one or both of the substrates put in contact. A bonding wave then propagates over the entire span of the substrates in several seconds to bring the two substrates together at the atomic scale. The bonding energy obtained at room temperature with molecular adhesion bonding is generally rather low relative to that observed between two solids connected in a covalent, ionic, or metallic manner. Thus, to obtain satisfactory bonding of the two substrates to each other, usually one of the substrate surfaces to be bonded is prepared before bonding. This is to increase the mechanical strength and/or increase the bonding interface quality.

Preparation for bonding typically involves a chemical treatment, or cleaning, of the substrate surfaces. Cleaning provides removal of particles, removal hydrocarbons, removal of metal contaminants, a low surface roughness (typically less than 5 Å RMS) and high hydrophily—a high density of silanol bonds (Si—OH bonds) finishing the surfaces to be bonded. Cleaning before bonding can include RCA type cleaning, which is a combination of a Standard Clean 1 (SC1) bath including ammonium hydroxide ($NH_4OH$), hydrogen peroxide ($H_2O_2$) and water ($H_2O$), and is suitable for removing particles and hydrocarbons. Another example is a Standard Clean 2 (SC2) bath of hydrochloric acid (HCl), hydrogen peroxide ($H_2O_2$) and water ($H_2O$), which is suitable for removing metal contaminants. Further examples are cleaning with an ozone ($O_3$) solution suitable for removing organic contaminants, and cleaning with a Sulfuric Peroxide Mixture (SPM), a solution containing a mixture of sulfuric acid and oxygenated water. Monitoring the different cleaning parameters, particularly bath temperatures prevents certain defects from appearing at the bonding interface of the bonded structure.

SMART-CUT® methods are often used for transfer of a thin layer from the donor substrate to a receiver substrate. (See "Silicon Wafer bonding technology for VLSI and MEMS applications", S. S. Iyer and A. J. Auberton-Hervé, IEE, 2002.) However, SMART-CUT® and similar methods are susceptible to the problem of edge voids, or holes in the thin layer that is transferred, located in the peripheral region of the receiver substrate. Edge voids are zones where transfer has not been successful, typically having a diameter between 50 µm and 2 mm located between 0.5 to 5 mm from the edge of the structure.

Edge voids are macroscopic defects due to poor edge bonding of the substrates. They are serious defects and generally are prohibitive. In fact, in the absence of a thin layer used as an active layer for forming electronic components at the location of an edge void, no component may be built at this location. Given the size of edge voids, an electronic component having at least one edge void is necessarily defective. FIG. 1 schematically shows a sectional view of an SOI structure including a receiver substrate 10, $SiO_2$ layer 16, and top layer 18. Layers transferred on the receiver substrate 10 present a hole, or edge void 12, with a diameter typically between 50 µm and 2 mm, situated 1-5 mm from the edge of the structure.

Blister type defects can also occur during transfer. Blisters are circular macroscopic defects with a diameter typically between 0.1 mm and 3 mm, visible after transfer of a thin layer.

In the case of an SOI structure obtained by the SMART-CUT® method, bonding a receiver substrate (Si) on an oxidized and implanted donor substrate may lead to the formation of blisters on the structure obtained after the transfer. These blisters result from local separation between the receiver silicon and the oxide of the thin layer transferred, as shown in FIG. 2. Separation can result from possible particles, traces of hydrocarbons, or even surface irregularities (micro-roughness that is higher locally) at the surface of one or both of the substrates put in contact.

In the case where bonding is performed in view of a SMART-CUT® or similar layer transfer method (hereinafter "formation of an SOI"), blisters 14 created at the bonding interface between the donor substrate and the receiver substrate may expand during detachment annealing, damaging the useful layer of the final structure obtained after the transfer. The SOI structure of FIG. 2 includes receiver substrate 10, SiO2 layer 16, and top layer 18. As diagrammed in FIG. 2, blisters 14 may be located at the center or at the periphery of the structure. Blisters are prohibitive defects for an SOI.

Blister and edge void defects are connected to the bonding and preparation of the surface; cleaning prior to bonding can reduce or prevent the occurrence of these defects. For example, blister defects at the bonding interface can be prevented by using a low concentration SC1 bath, especially at low temperature of less than about 65° C. Edge void defects at the bonding interface after transfer can be prevented by using an SC1 bath at high temperature, typically greater than or equal to 70° C.

Unfortunately, the disparate temperatures required to address each defect do not allow for prevention of both the blister and edge void defects. Accordingly, there is a need in the art for a cleaning step that reconciles these two treatments and provides a bonding interface free of both blister and edge voids defects.

SUMMARY OF THE INVENTION

The present invention addresses the aforementioned problems by removing the need for compromise in the cleaning process. In particular, the invention is targeted at preventing the appearance of edge void and blister defects at the bonding interface between two substrates.

The present invention is directed to improvements in a method for molecularly bonding first and second substrates together by placing them in surface to surface contact. The improvement includes, prior to placing the substrates in contact, cleaning the surface of one or both of the substrates in a manner to provide a cleaned surface that is slightly roughened compared to a conventionally polished surface. Also, the improvement includes heating at least one or both of the substrates prior to placing the substrates in contact while retaining the heating at least until the substrates are in surface to surface contact.

In one embodiment of the invention, the heating concludes no later than the end of the bonding wave propagation between the two substrates. Advantageously, the cleaning of one or both substrate surfaces can include an etching that leads to an increase in the roughness of the etched surface by about 0 to about 20%, or etching to remove a thickness of less than 15 Angstroms. Cleaning can also be accomplished by the application or one or more of a variety of chemical baths, including an $NH_4H$, $H_2O_2$, and $H_2O$ bath, an $NH_4OH$, $H_2O_2$, and $H_2O$ bath followed by a HCl, $H_2O_2$, and $H_2O$ bath, an ozone bath followed by an $NH_4OH$, $H_2O_2$, and $H_2O$ bath and a subsequent HCl, $H_2O_2$, and $H_2O$ bath, a sulfuric acid and oxygenated water bath followed by a $NH_4OH$, $H_2O_2$, and $H_2O$ bath and a subsequent HCl, $H_2O_2$, and $H_2O$ bath, or dry ozone followed by an $NH_4OH$, $H_2O_2$, and $H_2O$ bath followed by a HCl, $H_2O_2$, and $H_2O$ bath.

In accordance with preferred embodiments of the invention, the bath conditions are controlled to achieve the most beneficial results. In particular, the temperature of the $NH_4OH$, $H_2O_2$, $H_2O$ bath is generally less than 65° C., preferably between about 5° C. and 60° C., and more preferably between about 40° C. and 55° C. The bath also can have a weight ratio of $NH_4OH/H_2O_2$ of between about 1/2 and 6/6, preferably between about 1/2 and 3/4. These baths are typically applied for several minutes, preferably about three minutes.

The preferred HCl, $H_2O_2$, $H_2O$ bath has an HCl content by weight of between about 0.3% and 2%, an $H_2O_2$ content by weight of between about 0.3% and 2%, a temperature of about 30° C., and is be applied for several minutes, preferably about three minutes.

Further embodiments of the invention include plasma activation of one or both surfaces, implemented after cleaning and before bonding. The plasma may be $O_2$ and/or $N_2$ based plasma, which helps reduce the roughness of one or both substrates.

Before the bonding, the heating may be applied locally at the peripheral zone of at least one of the substrates. The heating can be applied uniformly over at least one substrate, leading to a substrate temperature of between about 35° C. and 90° C., typically between about 45° C. and 70° C. Heating is accomplished by thermal conduction or by radiation.

Another embodiment of the invention provides a method of forming a structure including a thin layer in a semiconductor material taken from a donor substrate. The method includes the steps of contacting a second substrate with a donor substrate to bond the substrates together, cleaning the surface of one or both substrates before putting the substrate surfaces in close contact, transferring part of the donor substrate to the second substrate to form a thin layer on the second substrate, and bonding the substrates.

BRIEF DESCRIPTION OF THE DRAWINGS

Other characteristics and advantages of the invention are apparent from the following description of the attached drawings. These examples are purely illustrative and non-limiting.

FIG. 1 is a sectional view of a prior art SOI structure with an edge void;

FIG. 2 is sectional view of a prior art SOI structure with a blister defect;

FIG. 3 illustrates the occurrence of blisters (unbroken lines) and edge voids (broken lines) in relation to the temperature of an SC1 bath;

FIG. 4a illustrates propagation of a bonding wave when bonding is initiated from the center of an SOI structure;

FIG. 4b illustrates propagation of a bonding wave when bonding is initiated from an edge of the SOI structure; and FIG. 5 illustrates a cartography of the temperature on a silicon substrate.

DETAILED DESCRIPTION OF THE PREFERRED EMBODIMENTS

The present invention relates to a method for bonding two substrates together that addresses the problems of both blister and edge void defects.

In FIG. 3, the occurrence of blisters, depicted by a solid line, and edge voids, depicted by a broken line, are shown as a function of the temperature of an SC1 bath. Cleaning a substrate with a high temperature SC1 bath leads to etching or roughness on the surface of the cleaned substrates. The resulting etching or roughness prevents edge voids, but promotes the appearance of blisters. Cleaning a substrate with lower temperature SC1 bath, typically less than 65° C., leads to low roughness and very slight etching on the surface of the cleaned substrates, preventing blisters but promoting the appearance of edge voids. The low temperature SC1 bath removes less than 15 Angstroms of the substrate surface, typically about 5-10 Å.

In preferred embodiments of the invention, cleaning conditions produce cleaned surfaces having a roughness and a thickness that are virtually unchanged by cleaning, meaning the existence of only a light etching is acceptable. This level of etching, or slight deterioration, can be obtained by means of a low temperature SC1 bath, typically less than about 65° C. In a particularly preferred embodiment, the cleaning step is performed so that the cleaned surface has a roughness that is unchanged by cleaning or is increased by no more than about 20%. Roughening by cleaning is associated with the etching produced by cleaning. Therefore, any type of cleaning that leads to etching of less than 15 Angstroms, such as about 5-10 Å, is preferred. Blisters can be reduced by preventing deterioration of one or both substrate surfaces.

It is increasingly important to produce structures free of edge voids. The appearance of edge voids is prevented by monitoring the bonding process, specifically by monitoring the speed of propagation of the bonding wave between the substrates. Embodiments of the present invention reduce the occurrence of edge voids by monitoring the propagation speed of the bonding wave by heating one or both of the substrates to be bonded. The speed of propagation of the bonding wave is affected by both the hydrophilic character and the low roughness of the substrate surfaces.

Blister and edge void defects are the result of independent factors. Accordingly, embodiments of the present invention are directed to the reduction or elimination of both defects through the method disclosed herein. This method includes cleaning one or both substrates to be bonded to produce slightly roughened surface(s). This step contributes to the reduction and/or elimination of the appearance of blisters.

The term "slightly roughened" means a limited increase in roughness compared to a mirror polished flat surface of the conventional type typically believed to be necessary for adequate bonding. In a preferred embodiment, slightly roughened corresponds to an increase in roughness of the cleaned surface that is between about 0 and 20%. To obtain a slightly roughened surface, etching with a thickness of less than 15 Angstroms can be implemented for the cleaning. Cleaning that includes several steps can also be implemented.

Cleaning of the substrate(s) to be bonded can be implemented by combining one or more baths. The baths utilized during the cleaning step can increase the surface the substrate(s) by about 0 to about 20%, and can achieve etching with a thickness of less than about 15 Angstroms. In one embodiment of the invention, cleaning can be accomplished by an SC1 bath ($NH_4OH$, $H_2O_2$, $H_2O$-based mixture) performed at a temperature of less than 65° C. The SC1 bath can be performed at a temperature of between about 5° C. and 60° C. for several minutes. In one preferred embodiment, the SC1 bath temperature is about 40° C.-55° C., with a duration of about three minutes. The $NH_4OH/H_2O_2$ concentration (expressed in percent by weight) of the SC1 bath is typically between about 1/2 and 6/6, preferably about 1/2 or 3/4. Cleaning by an SC1 bath typically results in etching of approximately 5-15 Angstroms on a thermal oxide that is embrittled by the ionic implantation necessary for forming such an SOI.

The SC1 bath can be preceded by an ozone bath, an SPM ($H_2SO_4/H_2O_2$-based mixture) or even by a dry ozone based cleaning ($UV/O_3$ atmosphere) to remove contamination, particularly organic contamination. The SC1 bath can also be followed by an SC2 bath performed at a low temperature of about 30° C. for about three minutes, with a low concentration of about 0.3 to 2% for HCl and about 0.3 to 2% for $H_2O_2$, expressed as a percent by weight, with the remaining amount being water.

Utilization of an SC2 bath allows for removal of a large portion of the metal contaminants without deteriorating the hydrophilic nature of the substrates to be bonded, thus promoting bonding wave propagation when bonding is initiated.

Additionally, the substrate(s) can undergo a plasma activation treatment, preferentially an $O_2$ and/or $N_2$-based plasma. This plasma activation step is an additional cleaning step that can be classified as a dry cleaning step with a smoothing character. Plasma activation can improve the surface condition of one or both substrates to be bonded. Preferably, the plasma activation treatment is performed between the steps of cleaning and bonding, but it can also be done before the SC1 bath, in order to remove organic contaminants.

Accordingly, preferred embodiments of the invention include cleaning by a succession of steps. These steps collectively achieve the desired roughness of the substrate surfaces as set forth above.

The method further includes heating at least one substrate prior to bonding, with heating beginning prior to contact of the substrates and ending at the time of contact. In preferred embodiments, heating concludes no later than the end of the bonding wave propagation between the two substrates. This heating step helps achieve reduction and/or elimination of edge voids. The substrate(s) to be bonded can be heated in a temperature range of about 35° C. to 90° C., and preferably about 45° C. to 70° C. The temperature range is optimized so that the temperature of the substrate does not reach the point where the bonding energy is reduced; if substrates are bonded at a too high temperature, the bonding will be ineffective.

Preferably, bonding is performed without the application of adhesive or other glue. The water absorbed on each of the surfaces in contact (several monolayers of water) serves as an adhesive and ensures adhesion of the two substrates in contact through Van der Waals forces. If the substrates are heated at too high a temperature, most of the absorbed water is evaporated, making bonding impossible. In this situation, the bonding wave is unable to correctly propagate over the surface of one or both substrates to be bonded. Therefore, embodiments of the present invention utilize the lowest heating temperature that allows a reduction or elimination of edge voids, without a resulting drop in bonding energy. A drop in bonding energy can lead to other defects, such as the appearance of blisters after transfer of the thin layer.

In a further embodiment, heating occurs or is applied only in the zone where it is expected that edge voids may appear. For example, if bonding of two substrates having a circular shape is initiated from the edge of one substrate, it is possible to only heat the edge diametrically opposed to this point. Therefore, the critical zone for the appearance of edge voids is heated without negatively affecting bonding over the remainder of the substrate surfaces. In other words, bonding wave propagation can still occur over the rest of substrate surfaces.

FIG. 4a illustrates bonding wave propagation when bonding of two substrates is initiated from the center of the substrate surface(s). The peripheral region where possible edge voids 20 are expected is represented by dots. Bonding wave propagation 22 as it occurs in this instance is represented by arrows. FIG. 4b illustrates bonding wave propagation 24 when bonding of two substrates is initiated from the edge of the substrate surface(s).

Heating can be applied locally or over the entire surface of one or both substrates and can be accomplished by thermal conduction. For example, the substrate surface(s) can be contacted with a support that transmits heat. Radiation can also be applied, such as through use of a halogen lamp to illuminate all or part of the substrate(s).

In accordance with a preferred embodiment of the invention, the zone where edge voids may appear remains at the desired temperature until the surfaces in this zone are bonded. The duration of heating depends on the device utilized to raise and control the temperature of the heated zone. For example, when using a halogen lamp issuing a power of 500 Watts, the typical duration of heating is between about 15 and 90 seconds. This time range depends on the distance between the substrates and the lamp.

When bonding is initiated at the edge of a substrate, the opposite edge preferably reaches its hottest point after heating for 15 seconds, reaching a temperature of about 50° C. When heating is applied for 50 seconds under the same conditions, the maximum temperature measured on one or both substrates reaches about 70° C.

FIG. 5 shows a cartography of the temperature on a silicon substrate with a diameter equal to 300 mm after 15 seconds of local heating. In this case, edge voids are expected in the top portion of the substrate, due to bonding initiated in the bottom part of this substrate.

Methods of the present improve bonding during formation of an SOI structure, particularly in regards to SMART-CUT® Technology. The improved bonding method prevents the appearance of both edge voids and blisters, improving the yield and quality of the resulting structure. This virtual elimination of blisters and edge voids is particularly advantageous when a high dose of hydrogen is implanted (H alone) or in co-implantation of helium and hydrogen, as these processes are particularly susceptible to blister formation. For example, when transfer is performed by the SMART-CUT® method, an embrittlement zone is formed before bonding by the implantation of atomic or ionic species in the thickness of the donor substrate. After bonding, the donor substrate is detached at the embrittlement zone in such a way as to transfer a thin layer onto a second substrate. There is an increased risk of defects at this embrittlement zone, which defects can be reduced by employing the methods of the present invention.

The invention allows broader use of substrates by preventing the screening of substrates upstream from the method. Screening is conventionally carried out at the location where edge voids are likely to appear, and results in the rejection of a significant number of substrates. Because the methods of the invention reduce or prevent the appearance of edge voids, screening is unnecessary. Thus, the invention allows for less wasted material and results in a greater amount of usable product.

The low temperature of the RCA cleaning baths presents an economical advantage by increasing the lifetime of the baths. Under the conditions set forth according to various embodiments of the invention, there is little evaporation of the chemical products present in the baths. Therefore, the chemicals need not be replaced as frequently, requiring lesser quantities of these expensive products.

The cleaning conditions outlined in embodiments of the invention are compatible with cleanings that occur in the SMART-CUT® method (cleaning after oxidation, after thermal treatments, etc.), allowing for optimization of the cleaning and bonding steps that are part of the SMART-CUT® method. For example, cleaning can be accomplished with a single bath and even a single piece of equipment. The bonding step can be adapted for compatibility with various procedures used in the art by modifying the bonding duration and temperature parameters.

Furthermore, methods of the invention provide substrates with low roughness before bonding, which leads to stronger bonding and a bonding interface that is easier to stabilize.

The methods of the invention also eliminate the dichotomy of having to choose one type of defect over another—namely, edge voids vs. blisters. The present invention allows the removal of both defects by adjusting the temperature of the SC1 bath during cleaning of the substrate(s) to be bonded. Parameter adjustment to achieve a reduction in defects is easily realized, since one can independently adjust the cleaning conditions to minimize the appearance of blisters, and the bonding conditions to eliminate edge voids.

Examples

Below are data from the results obtained by using the method of the invention.

In the case of Si/SiO2 bonding implanted to make an SOI structure by the SMART-CUT® method, the receiver substrate Si is less sensitive to cleaning (less easily etched and/or roughened). The typical roughness of such a receiver substrate, measured by AFM on 10×10 $\mu m^2$ surfaces, is less than or equal to 1 Angstrom RMS. For example, the donor substrate of surface oxidized silicon implanted by helium and hydrogen co-implantation is easily roughened and etched by cleaning since the substrate is embrittled by the implantation. Its roughness, approaching 1.2-1.4 Angstroms RMS before cleaning, reaches approximately 2 Angstroms RMS after an RCA cleaning with an SC1 bath at a temperature of 75° C., leading to etching of 30 Angstroms. On the other hand, if the same donor substrate is subjected to the same cleaning at 40° C., its roughness remains unchanged, in the range of 1.2-1.4 Angstroms RMS, and the corresponding etching is close to 5 Angstroms. The occurrence of blisters is then approximately four times less after cleaning at 40° C., compared to the same cleaning at 75° C.

Below are data from examples of embodiments of a structure without blisters or edge voids.

In this first example, the SOI structure is obtained according to the SMART-CUT® method with local, short-duration heating by thermal oxidation and co-implantation of helium and hydrogen at concentrations on the order of $1\times10^{16}$ and $1\times10^{16}$ at/cm² respectively, followed by cleaning. Cleaning of the substrates can be accomplished by an ozone bath followed by rinsing, or an SC1 bath at 40° C. for three minutes followed by rinsing (percent by weight dosage of 3% for $NH_4OH$ and 4% for $H_2O_2$, the rest is water), an SC2 bath at 30° C. for three minutes followed by rinsing (percent by weight dosage of 0.7% for HCl and 0.5% for $H_2O_2$), or drying. Bonding can be accomplished with local, short-duration heating, brushing and rinsing of the two substrates before bonding, or drying by centrifugation. Bonding can also be accomplished by placing the substrates on a bonding station facing each other, contacting the substrates, and initiating local heating by halogen lamp with a power equal to 500 Watts for 36 seconds, where bonding is initiated during local heating 20 seconds after heating begins. Detachment and finishing of the SOI structure are accomplished according to the SMART-CUT® method.

In a second example, the SOI structure is obtained according to the SMART-CUT® method with local intermediate heating by thermal oxidation and implantation of hydrogen at a high dose, on the order of $7\times10^{16}$ at/cm² and cleaning. Cleaning can be accomplished by an SC1 bath at 50° C. for three minutes followed by rinsing, an SC2 bath at 30° C. for three minutes followed by rinsing, or drying. Next, the donor substrate is activated by pure $O_2$ plasma. The substrates then are bonded by local intermediate heating. Local intermediate heating includes brushing followed by rinsing of the substrates, drying by centrifugation, placing the substrates on a bonding station with the substrates facing each other, contacting the substrates, and then initiating local heating by a 500-Watt halogen lamp for 50 seconds. Bonding is initiated 35 seconds after heating begins. Lastly, detachment and finishing of the SOI structure according to the standard SMART-CUT® method are accomplished.

The term "about," as used herein, should generally be understood to refer to both numbers in a range of numerals. Moreover, all numerical ranges herein should be understood to include each whole integer within the range.

The embodiments and example illustrated and discussed in this specification are intended only to teach those skilled in the art the best way known to the inventors to make and use the invention. The above-described embodiments of the invention may be modified or varied, without departing from the invention, as appreciated by those skilled in the art in light of the above teachings. Accordingly, all expedient modifications readily attainable by one of ordinary skill in the art from the disclosure set forth herein, or by routine experimentation therefrom, are deemed to be within the spirit and scope of the invention as defined by the appended claims.

What is claimed is:

1. In a method for molecularly bonding first and second substrates together by placing them in surface to surface contact, the improvement which comprises:

prior to placing the substrates in contact, cleaning the surface of one or both of the substrates in a manner to provide a cleaned surface that is slightly roughened compared to a conventionally polished surface, wherein the cleaning includes etching to roughen the cleaned surface by up to about 20% compared to a polished surface;

heating at least one or both of the substrates prior to placing the substrates in contact; and retaining the heating at least until the substrates are in surface to surface contact and until a bonding wave propagates between the bonding substrates to reduce or eliminate edge voids during bonding.

2. The method of claim 1, wherein the heating ends no later than when the bonding wave propagation is complete.

3. The method of claim 1, wherein the cleaning includes etching the surface to remove a thickness of less than 15 Angstroms.

4. The method of claim 1, which further comprises treating at least one substrate with a plasma activation treatment prior to placing the substrates in surface to surface contact.

5. The method of claim 4, wherein plasma activation is performed after the cleaning.

6. The method of claim 4, wherein the plasma activation includes applying an $O_2$-based plasma, $N_2$-based plasma, or $O_2$ and $N_2$-based plasma.

7. The method of claim 4, wherein the plasma treatment is conducted in a manner to reduce surface roughness of one or both substrates.

8. In a method for molecularly bonding first and second substrates together by placing them in surface to surface contact, the improvement which comprises:

prior to placing the substrates in contact, cleaning the surface of one or both of the substrates in a manner to provide a cleaned surface that is slightly roughened by up to about 20% compared to a conventionally polished surface, and heating at least one or both of the substrates prior to placing the substrates in contact while retaining the heating at least until the substrates are in surface to surface contact and until a bonding wave propagates between the bonding substrates to reduce or eliminate edge voids during bonding, wherein the cleaning includes applying a bath that contains $NH_4OH$, $H_2O_2$ and $H_2O$ having a $NH_4OH/H_2O_2$ weight ratio of between about 1/2 and 3/4.

9. The method of claim 8, wherein the cleaning further includes applying a bath that includes $HCl$, $H_2O_2$ and $H_2O$.

10. The method of claim 9, wherein the cleaning includes sequentially applying a bath of ozone, followed by the $NH_4OH$, $H_2O_2$, and $H_2O$ bath, and then by the $HCl$, $H_2O_2$, and $H_2O$ bath.

11. The method of claim 9, wherein cleaning includes sequentially applying a bath of sulfuric acid and oxygenated water, followed by the $NH_4OH$, $H_2O_2$ and $H_2O$ bath, and then by the $HCl$, $H_2O_2$, and $H_2O$ bath.

12. The method of claim 9, wherein cleaning includes applying a dry ozone bath, followed by the $NH_4OH$, $H_2O_2$ and $H_2O$ bath, and then by the $HCl$, $H_2O_2$, and $H_2O$ bath.

13. The method of claim 12, wherein the $HCl$, $H_2O_2$, and $H_2O$ bath has an $HCl$ content of about 0.3% to 2% by weight, an $H_2O_2$ content of about 0.3% to 2% by weight, a temperature of about 30° C., and is applied for about three minutes.

14. The method of claim 8, wherein the $NH_4OH$, $H_2O_2$, and $H_2O$ bath has a temperature of less than 65° C. when applied.

15. The method of claim 14, wherein the $NH_4OH$, $H_2O_2$, and $H_2O$ bath is at a temperature between about 40° C. and 55° C., and is applied for about three minutes.

16. The method of claim 8, wherein the heating is applied locally at a peripheral zone of at least one of the substrates.

17. The method of claim 16, wherein the heating includes thermal conduction.

18. The method of claim 16, wherein the heating includes radiation.

19. The method of claim 8, wherein heating is conducted and retained on both substrates at a temperature of between about 35° C. and 90° C.

20. The method of claim 8, wherein the heating is applied uniformly over the entire surface of at least one of the substrates to be bonded.

21. The method of claim 8, which further comprises transferring a part of the first substrate to the second substrate to form a thin layer on the second substrate.

22. The method of claim 8, wherein the first and second substrates are made of semiconductor materials.

23. The method of claim 8, wherein the heating ends no later than when the bonding wave propagation is complete.

* * * * *